United States Patent [19]

Merrem et al.

[11] Patent Number: 4,701,300

[45] Date of Patent: Oct. 20, 1987

[54] POLYAMIDE ESTER PHOTORESIST FORMULATIONS OF ENHANCED SENSITIVITY

[75] Inventors: Hans J. Merrem, Seeheim; Rudolf Klug, Aschaffenburg; Thomas Herold, Brensbach, all of Fed. Rep. of Germany

[73] Assignee: Merck Patent Gesellschaft mit beschrankter Haftung, Darmstadt, Fed. Rep. of Germany

[21] Appl. No.: 818,950

[22] Filed: Jan. 15, 1986

[30] Foreign Application Priority Data

Jan. 15, 1985 [DE] Fed. Rep. of Germany ....... 3501028
Apr. 6, 1985 [DE] Fed. Rep. of Germany ....... 3512544

[51] Int. Cl.$^4$ .................. G03C 1/71; G03C 1/68; G03C 1/70
[52] U.S. Cl. .................. 430/196; 430/197; 430/281; 430/283; 430/285; 430/927
[58] Field of Search ............... 430/197, 196, 927, 283, 430/285, 281

[56] References Cited

U.S. PATENT DOCUMENTS

| | | | |
|---|---|---|---|
| Re. 30,186 | 1/1980 | Rubner et al. | 430/283 |
| 4,251,619 | 2/1981 | Kurita | 430/281 |
| 4,287,294 | 9/1981 | Rubner et al. | 430/287 |
| 4,329,419 | 5/1982 | Goff et al. | 430/283 |
| 4,329,556 | 5/1982 | Rubner et al. | 430/197 |
| 4,369,247 | 1/1987 | Goff et al. | 430/283 |
| 4,540,650 | 9/1985 | Klug et al. | 430/283 |
| 4,547,455 | 10/1985 | Hiramoto et al. | 430/283 |
| 4,548,891 | 10/1985 | Riediker et al. | 430/283 |

FOREIGN PATENT DOCUMENTS 047184 2/1981 European Pat. Off. .

*Primary Examiner*—Charles L. Bowers, Jr.
*Attorney, Agent, or Firm*—Millen & White

[57] ABSTRACT

Photoresist formulations for forming relief structures from highly heat-resistant polyimide polymers, containing in an organic solvent in essence at least (a) one polyamide ester prepolymer carrying photopolymerizable radicals
(b) a radiation-reactive copolymerizable unsaturated compound
(c) a photosensitizer
(d) a photoinitiator
(e) a leuco dye, exhibit enhanced photosensitivity if they contain as the photoinitiator a compound of the type of the N-azidosulphonylarylmaleimides and as leuco dye a compound of the type of the triarylmethanes.

16 Claims, No Drawings

POLYAMIDE ESTER PHOTORESIST FORMULATIONS OF ENHANCED SENSITIVITY

BACKGROUND OF THE INVENTION

The invention relates to photoresist formulations for forming relief structures of highly heat-resistant polyimide polymers.

Such photoresist formulations are sought-after materials which are variously used in the preparation of photopolymerized coatings and in the photolithographic production of photopolymerized relief structures. The main uses in this area are the manufacture of microelectronic and optoelectronic components and circuits, where such materials find utility as photoresists in the production of circuit structures or therein as particular heat- and chemical-resistant protective or passivating coats, as insulation coats, dielectrics or, in the case of liquid crystal display cells, as orientation coats. Further uses are as photoresist, as etching and electroplating resist and as soldering resist in the manufacture of printed circuits, printing plates and other reprographic materials.

German Pat. Nos. 2,380,830 and 2,437,348 describe processes for preparing coatings and relief structures wherein photoresist formulations based on polyamide ester prepolymers carrying photopolymerizable radicals are imagewise exposed, unexposed portions are removed with developer and thereupon the resulting images are heat-treated, the prepolymer forming the relief structure being converted into a highly heat-resistant polyimide polymer.

However, these original systems had only moderate sensitivity, so that adequate photocrosslinking and the provision of a degree of resolution and relief structure edge steepness as required for microelectronics required minimum exposure times of about 3 minutes with conventional sources of radiation. In the case of coating thicknesses of up to about 5 $\mu$m, for which range it is possible to assume an approximately linear relationship between coating thickness and required minimum exposure energy, this equates to minimum exposure energies of 500–1,000 mJ/cm$^2$.$\mu$m. In the meantime, these photoresist systems have undergone various developments and improvements, in particular with regard to enhancing the sensitivity, to use shorter exposure times to obtain high economy in use.

For instance, the compositions have added to them sensitivity-enhancing additives such as, for example, photoinitiators and photosensitizers and radiation-reactive copolymerizable unsaturated compounds, if desired in combination with one another.

For instance, in German Pat. No. 2,919,841 enhanced sensitivity is obtained by addition of photoinitiators of the type of the N-axidosulphonylarylmaleimides. According to European Offenlegungsschrift No. 47,184 this is likewise possible through the addition of bisimidazole photo-initiators. Minimum exposure times around 60 seconds (corresponding to a minimum exposure energy of about 200–300 mJ/cm$^2$.$\mu$m) are required to obtain sharp-edged relief structures having a resolution of about 3 $\mu$m. U.S. Pat. No. 4,329,419 proposes adding to photoresist formulations based on photopolymerizable polyamide aster prepolymers a polyfunctional acrylate compound, an aromatic bisimidazole photoinitiator and a leuco dye. It emerges from said patent specification that the best obtainable minimum exposure energies are 40–120 mJ/cm$^2$.$\mu$m. European Patent Application No. 0,119,162 describes photoresist materials which, in addition to photopolymerizable polyamide ester prepolymers, contain metallocenes as photoinitiators and can, if desired, also contain coploymerizable acrylate and allyl compounds. Here the best minimum exposure energy values are 30–50 mJ/cm$^2$.$\mu$m. In U.S. Ser. No. 674,636 of November 26, 1984, (now abandoned) corresponding to German Patent Application No. 3,342,851, a reduction in the minimum exposure energy of polyamide ester photoresist formulations to values of 25–40 mJ/cm$^2$.$\mu$m is obtained by the addition of radiation-reactive copolymerizable vinyl or allyl compounds and of photoinitiators of the type of the N-azidosuplhonylarylmaleimides.

Nonetheless, the sensitivity of such photoresist systems still does not meet the higher present-day demands for an efficient and economic production of microelectronic components and circuits.

SUMMARY OF THE INVENTION

It is thus an object of this invention to reduce the minimum exposure energies or times required for such systems even further.

Upon further study of the specification and appended claims, further objects and advantages of this invention will become apparent to those skilled in the art.

It has now been found, surprisingly, that the sensitivity of such photoresist systems can be enhanced to values down to below 10 mJ/cm$^2$.$\mu$m if these systems contain as a pahotoinitiator a compound of the type of the N-axidosulphonylarylmaleimides and a leuco dye of the type of the triarylmethanes.

The invention thus provides photoresist formulations for forming relief structures highly heat-resistant polyimide polymers containing in an organic solvent in essence at least (a) one polyamide ester prepolymer carrying photopolymerizable radicals
(b) a radiation-reactive copolymerizable unsaturated compound
(c) a photosensitizer
(d) a photoinitiator
(e) a leuco dye, wherein the photoinitiator is a compound of the type of the N-axidosuplhonylarylmaleimides and the leuco dye is a compound of the type of the triarylmethanes.

The invention also provides a process for preparing relief structures from highly heat-resistant polyimide polymers by coating a substrate with a photoresist formulation, drying the coat, subjecting the coat to imagewise exposure, detaching the non-irradiated parts of the coat and heat-treating the resulting relief structures, wherein a photoresist formulation according to the invention is used.

DETAILED DISCUSSION

The polyamide ester prepolymers which carry photopolymerizable radicals and which form the base material of the photoresist formulations according to the invention are known from the patent specifications cited above, all of which disclosures are entirely incorporated by reference herein as are the references disclosed below. The radiation-reactive soluble polymers suitable for use as photoresists are polyaddition or polycondensation products of polyfunctional carbocyclic or heterocyclic compounds carrying radiation-reactive radicals, with diamines, diisocyanates, bis-acid chlorides or dicarboxylic acids. Both in the prior art and for this invention, preference is given to polycondensates of pyromellitic acid which carries two radiation-reactive radicals bonded in ester fashion to carboxyl groups, and a diamine containing at least one cyclic structural element, such as, for example, 4,4'-diaminodiphenyl ether, 4,4'-diaminodiphenylmethane, 4,4'-diaminodiphenyl sulphone or 2,4-diaminopyridine. The various radiation-reactive radicals which can contain these soluble polymeric precursors are likewise disclosed by these publications. They are in particular such radiation-reactive allyloxy, acryloyloxyalkoxy and methacryloyloxyalkoxy groups, such as, for example, acryloyloxyeth-2-yloxy or methacryloyloxyeth-2-yloxy groups, as are bonded in ester fashion to carboxyl groups, and also the allyloxy- and/or allylthio-containing ester groups described in German Offenlegungsschrift No. 3,227,584. The soluble polymeric precursors contained in the photoresist formulations according to the invention generally have molecular weights between 2,000 and 100,000, preferably between 4,000 and 60,000.

In a particularly preferred embodiment of the present invention, the photopolymerizable polyamide ester prepolymer is a polycondensate of pyromellitic acid which has two carboxyl groups esterified with hydroxyethyl methacrylate, and 4,4'-diaminodiphenyl ether.

The radiation-reactive copolymerizable unsaturated compounds contained in the photoresist formulations according to the invention are likewise known from photo-resist technology. They are mono-, di- or polyfunctional acrylic and allyl compounds, in particular acrylic and allyl esters and acrylic and allyl ethers of aliphatic cycloaliphatic or aromatic polyhydroxy compounds. Such compounds can be found in, for example, German Offenlegungsschrift No. 3,233,912, European Offenlegungsschrift No. 0,119,162 and U.S. Pat. No. 4,329,419. But the vinyl compounds described in German Patent Application No. 3,342,851, such as vinyloxy, vinylthio and vinylsulphonyl compounds, are likewise highly suitable.

Specific examples of copolymerizable compounds are: vinyl compounds such as 2-hydroxyethyl vinyl ether and 2-hydroxyethyl vinyl sulphone; acrylic compounds such as trimethylolpropane triacrylate, trimethylolpropane trimethacrylate, ethoxylated trimethylolpropane triacrylate, pentaerythritol triacrylate and pentaerythritol trimethacrylate; mono- and di-acrylates or -methacrylates of ethylene glycol or di-, tri- and tetraethylene glycol, such as, for example, ethylene glycol monoacrylate, triethylene glycol dimethacrylate, tetraethylene glycol monoacrylate, and tetraethylene glycol dimethacrylate; allyl ethers such as trimethylolpropane triallyl ether and pentaerythritol triallyl ether.

As a further component the photoresist formulations according to the invention contain at least one photosensitizer. Compounds suitable for this purpose are familiar from photoresist technology, examples being 4,4'-bis-(dimethylamino)-benzophenone (Michler's ketone), 4,4'-bis-(diethylamino)-benzophenone, benzoin ether, camphorquinone, anthraquinone or thioxanthone derivatives and also copolymerisable radiation-sensitive maleimides, such as, for example, N-phenylmaleimide.

The particularly high radiation-sensitivity of the photoresist formulations according to the invention is critically affected by the two further components, namely photoinitiator and leuco dye, which need to be jointly present in the photoresist composition. The photoinitiators to be used in the photoresists according to the invention together with a leuco dye to shorten the irradiation times are compounds of the type of the N-azidosuplhonylarylmaleimides. Such compounds and their use as photoinitiators in the preparation of relief structures are described in German Pat. Nos. 2,919,823 and 2,919,841. Particularly highly suitable for the use according to the invention are the compounds N-(4-azidosulphonylphenyl)-maleimide, 2-(N-maleimido)-naphthyl-5-sulphonyl axide and 2-(N-maleimido)-naphthyl-6,8-bisulphonyl axide. Particular preference is given to the compound N-(4-azidosulphonylphenyl)-maleimide.

The leuco dyes to be used according to the invention are compounds of the type of the triarylmethanes. These compounds are derived as leuco bases from the general class of the triphenylmethane dyes. They are largely colorless, but can be readily converted by oxidative processes, for example photochemically induced oxidations, into the colored triphenylmethane dyes.

In principle, the leuco bases of all known and customary triphenylmethane dyes are suitable for the intended use, since they exhibit substantially identical sensitization properties in the present photoresist formulations. However, preference is given to the use of triphenylmethane derivatives in which the phenyl radicals are substituted in the 4-position by alkyl-substituted amino groups, preferably dialkylamino groups. Alkyl is therein normally in each case an alkyl group having 1–6 C atoms. The phenyl radicals can also be modified by one or more alkyl substituents, chiefly methyl, or by other substituents customary with triphenylmethane dyes, such as halogen or carboxyl. Also suitable are the known modifications of such Leuco bases, such as appropriately substituted triphenylcarbinols or lactonated triphenylcarbinols. Examples of leuco dyes to be used according to the invention are tris-(4-dimethylaminophenyl)-methane, tris-(4-diethylaminophenyl)-methane, tris-(4-diethylamino-o-tolyl)-methane, tris-(4-dihexylaminophenyl)-methane, tris-(4-dihexylamino-o-tolyl)-methane and 2-carboxy-r-dimethylaminophenyl-bis-(4-dimethylaminophenyl)-methane, tris-(4-diethylamino-o-tolyl)-methane and 2-carboxy-4-dimethylaminophenyl-bis-(4-dimethylaminophenyl)-carbinol-lactone.

It was found that the enhanced sensitivity of the polyamide ester photoresists due to the addition according to the invention of N-azidosulphonylarylmaleimide photoinitiator and triarylmethane leuco dye is evidently based on an unexpected synergistic effect where during exposure additional radiation energy is apparently transferred by the leuco dye to the photoinitiator, thereby producing more intensive utilization of the received radiation energy and thus the speeding up of the exposure process in the photoresist coating. It has not been possible to demonstrate such an effect in the known resist systems already using such leuco dyes but different initiators (as disclosed for example in U.S. Pat. No. 4,329,419). In addition, the leuco dye content also shows the admittedly already known advantageous effect that through photochemicaly induced dye formation, the latent image in the exposed photoresist layer becomes visible at once, that is to say even before development.

In the photoresist formulations according to the invention, as a rule the photoinitiator is present in an amount of 1–15% by weight, preferably 2–10% by weight, and the leuco dye is present in an amount of 0.1–5% by weight, preferably 0.5–2.5% by weight, relative to the weight of polyamide ester prepolymer.

The compositions contain copolymerizable unsaturated compounds in 5–35% by weight, preferably 10–30% by weight, and photosensitiser in 1–15% by weight, preferably 2–10% by weight, each relative to the amount of prepolymer.

The photoresist formulations according to the invention are prepared in a manner known per se by dissolving the individual components or mixing with a suitable solvent customary in this technology. Suitable solvents for the stated components of the photoresists are for example ethylene glycol, glycol ethers such as glycol monomethyl ether, glycol dimethyl ether and glycol monoethyl ether, aliphatic esters such as ethyl acetate, hydroxyethyl acetate, alkoxyethyl acetate, n-butyl acetate or amyl acetate, ethers such as dioxane, ketones such as methyl ethyl ketone, methyl isobutyl ketone, cyclopentanone and cyclohexanone, dimethylformamide, dimethylacetamide, hexamethylphosphoramide, N-methylprrolidone, butyrolactone, tetrahydrofuran and mixtures of such solvents. The ready-for-use photoresist formulations contain as a rule 1–60% by weight, preferably 5–50% weight, of components dissolved in such solvents.

Furthermore, the photoresist formulations according to the invention can additionally contain additives and assistants which are customary in photoresist technology, for example dyes, pigments, plasticizers, adhesion promoters such as, for example, vinylsilanes, thermally activable free-radical-forming initiators, and also a wide variety of other polymers and resins, stabilizers and surface-active compounds which, in certain circumstances, can contribute to improving the film-forming or coating properties and/or to improving the adhesion of the coats applied to the substrates, to improving the mechanical strength, the chemical resistance, the flow resistance of the material, but also to influencing the viscosity of the photoresists. Such additives can be added in an amount of 0.1–15% by weight, relative to the total dissolved component content.

The photoresist formulations according to the invention can be applied on conventional manner to basically any desired substrate. However, in accordance with their chief intended use, namely the photolithographic production of conductor and semiconductor circuits, they are primarily used for coating substrates customary in this technology. These substrates are predominantly silicon materials which can be pure or surface-modified by oxidation, doping, coating with metals, semiconductors or insulators, and etching. Also possible are substrates known from liquid crystal display manufacture, such as glass and surface-modified or coated glass materials. The photoresist layers can be applied to a substrate in varying thickness. The most advantageous coating thickness in an individual case depends on various factors, in particular on the intended use for the coating to be prepared. It has in general been found to be advantageous for the resist coats to have a thickness of 0.1 $\mu$m to 200 $\mu$m. In semiconductor manufacture the photoresist coating thicknesses are customarily between 0.5 and 10 $\mu$m, preferably between 1 and 3 $\mu$m.

The photoresist coatings are applied to the clean substrate surface by conventional techniques, such as, for example, spraying, flow-coating, roller-coating, spin coating and dip-coating, whereafter the solvent is removed by evaporation so as to leave a radiation-sensitive photo-resist layer behind on the surface of the substrate. If desired, the removal of the solvent can be speeded up by heating the layer to temperatures of up to 120° C. The photoresist layer is then exposed to radiation which causes the reaction of the radiation-reactive components, thereby crosslinking the coating. It is customary to use actinic light, but it is also possible to use high-energy radiation such as X-rays or electron beam. The irradiation or exposure can be conducted through a mask original, but it is also possible to guide a columnated beam of the radiation across the surface of the radiation-sensitive layer. It is customary to use for the irradiation UV lights which emit radiation having a wavelength of 200–500 nm with an intensity of 0.5–60 mW/cm$^2$. Customary sources of radiation have an intensity of 5–6 mW/cm$^2$.

The photoresist formulations of enhanced photo-sensitivity due to the addition according to the invention of N-azidosulphonylarylmaleimide photoinitiators and triarylmethane leuco dyes permit reduction in the necessary minimum exposure energy, in general to values between 10 and 20 mJ/cm$^2$. $\mu$m and in favorable cases even to values below 10 mJ/cm$^2$. $\mu$m. In the case of coating thicknesses of 1–3 $\mu$m and a radiation output from the light source of 5 mW/cm$^2$ that corresponds approximately to a minimum exposure time of 1.5–10 seconds. An exposure time reduction made possible by such an enhancement in sensitivity constitutes an immense advance for the use of these polyamide ester photoresists in semiconductor technology.

After exposure, then, it is possible to develop an image pattern by baring parts of the substrate by treating the layer with a developer solution which removes the non-irradiated areas of the photoresist layer. The developer solution used is in generaly a mixture of one or more solvents known for the preparation of the photo-resist with a precipitant. Typical developer solutions are for example 4-butyrolactone/toluene, dimethylformamide/ethanol, dimethylformamide/methanol, methyl ethyl ketone/ethanol, and methyl i-butyl ketone/i-propanol, in each case in a ratio of 2:1 to 1:4. A particularly suitable developer liquid for developing relief images from the photoresist formulations according to the invention is a developer liquid which, according to German Offenlegungsschrift No. 3,246,403 consists only of an aliphatic ketone, preferably cyclopentanone. Developing, washing and drying gives sharp-edged resist images having a resolution of below 3 $\mu$m. By heat treatment at 200°–400° C. these images can be converted into hightly heat-resistant polyimide polymers which have excellent chemical, electrical and mechanical properties.

According to the invention, it is thus possible to offer those skilled in the art qualitatively particularly high-grade photoresist materials which, moreover, premit particularly economical use.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the preceding text and the following examples, all temperatures are set forth uncorrected in degrees Celsius and all parts and percentages are be weight, unless otherwise indicated.

EXAMPLE 1

(a) Photoresist comprising 5 g of polyamide ester prepolymer (obtained by reacting pyromellitic dianhydride with 2-hydroxyethyl methacrylate and then with thionyl chloride and then with 4,4'-diaminodiphenyl ether as described in German Pat. No. 2,437,348)

1.5 g of 2-hydroxyethyl vinyl sulphone
0.4 g of N-(4-azidosulphonylphenyl)-maleimide
0.125 g of 4,4'-bis-(dimethylamino)-benzophenone
0.05 g of tris-(4-dimethylaminophenyl)-methane
0.05 g of vinyltrimethoxysilane dissolved in 12 g of dimethylformamide (b) Application The photoresist formulation is spin-coated due to a silicon wafer and dried by heating. The resultant 1.5 μm thick layer is irradiatec through a photo mask with a mercury high-pressure lamp having an intensity of 5 mW/cm2 for 5 seconds. This corresponds to an exposure energy of 17 mJ/cm$^2$. μm. The non-irradiated photoresist portions are then washed away by development with a mixture of 50 parts by weight of j-butyrolactone and 50 parts by weight of toluene. The result obtained is a sharp-edged image having a resolution of better than 3 μm.

EXAMPLE 2 (COMPARATIAVE EXAMPLE)

(a) Photoresist: as in Example 1, except for the absence of tris-4-(dimethylaminophenyl)-methane (b) Application:

under the same application conditions as in Example 1 the necessary exposure time is 8 seconds, which corresponds to a minimum exposure energy of 27 mJ/cm$^2$.μm.

The photoresist formulations listed in the examples below are composed as in Example 1, except that the 2-hydroxyethyl vinyl sulphone was replaced by other copolymerizable compounds. The sensitivity is termed good when the exposure time under the application conditions of Example 1 is less than 8 seconds.

EXAMPLE 3

1.0 g of trimethylolpropane triacrylate Sensitivity: good

EXAMPLE 4

1.0 g of ethyxylated trimethylolpropane triacrylate Sensitivity: good

EXAMPLE 5

1.0 g of tetraethylene glycol dimethacrylate Sensitivity: good

EXAMPLE 6

1.0 g of triethylene glycol dimethacrylate Sensitivity: good

EXAMPLE 7

(a) Photoresist comprising 5 g of a polyamide ester prepolymer (obtained by reacting pyromellitic dianhydride with 2-hydroxyethyl methacrylate and then with thionyl chloride and then with 4,4'-diaminodiphenyl ether as described in German Pat. No. 2,437,348)
1 g of tetraethylene glycol diacrylate
0.25 g of N-(4-azidosulphonylphenyl)-maleimide
0.125 g of 4,4'-bis-(diethylamino)-benzophenone
0.05 g of tris-(4-dimethylaminophenyl)-methane
0.05 g of vinyltrimethoxysilane dissolved in 8 ml of 1:1 N-methylpyrrolidone/cyclopentanone (b) Application:

Under the same application conditions as in Example 1 the necessary minimum exposure energy is 12 mJ/cm$^2$.μm.

EXAMPLE 8

(a) Photoresist:

as in Example 7, except with tetraethylene glycol monoacrylate as copolymerizable compound.

(b) Application:

Under the same application conditions as in Example 1 the necessary minimum exposure energy is 8 mJ/cm$^2$.μm.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a photoresist composition useful for forming a relief structure of a highly heat-resistant polyimide polymer, comprising, together in an organic solvent effective amounts of
   (a) a polyamide ester prepolymer carrying photopolymerizable radicals,
   (b) a radiation-reactive copolymerizable unsaturated compound, (a) and (b) being combinable to provide said polyimide polymer,
   (c) a photosensitizer,
   (d) a photoinitiator, and
   (e) a leuco dye, the improvement wherein the photoinitiator is an N-azidosulphonylarylmaleimide photoinitiator and the leuco dye is a triarylmethane, the effective amounts of ingredients function to lower the minimum exposure energy of said composition to a value below 20 mJ/c$^2$.μm.

2. A composition of claim 1, wherein the photoinitiator is N-(4-azido-sulphonylphenyl)-maleimide, 2-(N-maleimido)-naphthyl-t-sulphonyl azide or 2-(N-maleimido)-naphthyl-5,8-bisulphonyl azide.

3. A composition of claim 2, wherein the photoinitiator is N-(4-azidosulfonylphenyl)-maleimide.

4. A composition of claim 2, wherein the leuco dye is a triphenylmethane.

5. A composition of claim 4, wherein the leuco dye is a triphenylmethane wherein the phenyl groups are substituted by 4-alkyl.

6. A composition of claim 4, wherein the leuco dye is tris-(4-dimethylaminophenyl)-methane, tris-(4-diethylaminophenyl)-methane, tris-(4-dimethylamino-o-tolyl)-methane, tris-(4-diethylamino-o-tolyl)-methane, tris-(4-dihexylaminophenyl)-methane, tris-(4-dihexylamino-o-tolyl-methane or 2-carboxy-4-dimethylaminophenyl-bis-(4-dimehtylaminophenyl)-carbinol-lactone.

7. A composition of claim 4 wherein the leuco dye is tris-(4-dimethylaminophenyl)-methane, tris-(4-diethylaminoo-tolyl)-methane or 2-carboxy-r-dimehtylaminophenyl-is-(4-dimethylaminophenyl)-carbinol-lactone.

8. A composition of claim 2 wherein the leuco dye is tris-(4-dimethylaminophenyl)-methane, tris-(4-diethylaminophenyl)-methane, tris-(4-dimethylamino-o-tolyl)-methane, tris-(4-diethylamino-o-tolyl)-methane, tris-(4-dihexylaminophenyl)-methane, tris-(r-diehxylamino-o-tolyl-methane or 2-carboxy-4-dimethylaminophenyl-bis-(4-dimethylaminophenyl)-carbinol-lactone.

9. A composition of claim 1, wherein the amount of photoinitiator is 1–15 wt % as based on the amount of prepolymer and of leuco dye 0.1–5 wt %.

10. A composition of claim 1, wherein the amounts of the ingredients are as follows:
(b) 5–35 wt %
(c) 1–15 wt %
(d) 1–15 wt %
(e) 0.1–5 wt % all based on the amount of prepolymer.

11. A composition of claim 1, wherein the amounts of the ingredients are as follows:
(b) 10–30 wt %
(c) 2–10 wt %
(d) 2–10 wt %
(e) 0.5–2.5 wt % all based on the amount of prepolymer.

12. A composition of claim 1, wherein the concentration of (a) to (e) in the solvent is 1–60 by wt % of components dissolved in the solvent.

13. A composition of claim 1, further comprising an effective amount of a pigment, plasticizer or adhesion promotor.

14. A composition of claim 1, wherein the leuco dye is tris-(4-dimethylaminophenyl)-methane.

15. A composition of claim 10, wherein the leuco dye is tris-(4-dimethylaminophenyl)-methane.

16. A composition of claim 3, wherein the leuco dye is tris-(4-dimethylaminophenyl)-methane.

* * * * *